United States Patent
Kawai et al.

(10) Patent No.: US 9,105,387 B2
(45) Date of Patent: Aug. 11, 2015

(54) RETAINER AND NOISE CURRENT ABSORBER

(75) Inventors: Hideharu Kawai, Nagoya (JP); Yoshiaki Yanase, Nagoya (JP)

(73) Assignee: Kitagawa Industries Co., LTD., Inazawa-shi, Aichi (JP)

(*) Notice: Subject to any disclaimer, the term of this patent is extended or adjusted under 35 U.S.C. 154(b) by 549 days.

(21) Appl. No.: 13/503,056

(22) PCT Filed: Oct. 22, 2010

(86) PCT No.: PCT/JP2010/068738
§ 371 (c)(1),
(2), (4) Date: Apr. 20, 2012

(87) PCT Pub. No.: WO2011/049208
PCT Pub. Date: Apr. 28, 2011

(65) Prior Publication Data
US 2012/0205367 A1    Aug. 16, 2012

(30) Foreign Application Priority Data
Oct. 22, 2009   (JP) ................................. 2009-243667

(51) Int. Cl.
| | |
|---|---|
| H01F 17/06 | (2006.01) |
| H01F 27/02 | (2006.01) |
| H01F 27/24 | (2006.01) |
| H05K 9/00 | (2006.01) |

(52) U.S. Cl.
CPC .............. *H01F 17/06* (2013.01); *H05K 9/0066* (2013.01); *H01F 2017/065* (2013.01)

(58) Field of Classification Search
CPC .......................... H01F 2017/065; H05K 9/0066
USPC ................................................. 336/175, 176
See application file for complete search history.

(56) References Cited

U.S. PATENT DOCUMENTS 4,885,559 A * 12/1989 Nakano ........................... 336/92
5,343,184 A    8/1994 Matsui et al.

FOREIGN PATENT DOCUMENTS

| CN | 1816978 A | 8/2006 |
|---|---|---|
| JP | 5-37453 Y2 | 9/1993 |
| JP | 10-032395 A | 2/1998 |
| JP | 100 32 395 | 2/1998 |
| JP | 2006-024702 A | 1/2006 |

(Continued)

OTHER PUBLICATIONS

Office Action for corresponding Chinese Patent Application No. 201080047837.1 issued Apr. 30, 2014 (including English Translation).
Notice Of Reasons For Rejection issued in corresponding Japanese Application No. 2009-243667 mailed on Oct. 15, 2013.
The International Preliminary Report on Patentability in corresponding PCT. Date of Mailing May 24, 2012.

(Continued)

*Primary Examiner* — Elvin G Enad
*Assistant Examiner* — Ronald Hinson
(74) *Attorney, Agent, or Firm* — Davis & Bujold, P.L.L.C.; Michael J. Bujold

(57) ABSTRACT

A retainer includes a pair of housings having opening surfaces; a connecting portion connecting outer peripheral surfaces of the pair of housings. The retainer is configured to be at a closed state with the opening surfaces of the pair of housing put together and to be at an open state with the opening surfaces of the pair housings separated. Parts of wall surfaces, constituting the housings, are structured as flexible walls capable of deforming, and the connecting portion is connected to the flexible walls.

15 Claims, 11 Drawing Sheets

(56) References Cited

FOREIGN PATENT DOCUMENTS

| | | |
|---|---|---|
| JP | 2008 021 702 | 1/2008 |
| JP | 2008-021702 A | 1/2008 |

OTHER PUBLICATIONS

Japanese Office Action Corresponding to 2009-243667 mailed May 13, 2014.
Form PCT/ISA/210.

* cited by examiner

RETAINER AND NOISE CURRENT ABSORBER

CROSS-REFERENCE TO RELATED APPLICATIONS

This international application claims the benefit of Japanese Patent Application No. 2009-243667 filed Oct. 22, 2009 in the Japan Patent Office, and the entire disclosure of Japanese Patent Application No. 2009-243667 is incorporated herein by reference.

TECHNICAL FIELD

The present invention relates to a retainer having a pair of housings respectively having opening surfaces and a connecting portion connecting outer peripheral surfaces of the pair of housings and further relates to a noise current absorber applying the retainer.

BACKGROUND ART

As a method of absorbing noise of electric current flowing at an electric cable, there have been conventionally known a technique by which a magnetic body is fitted so as to surround the electric cable, and noise of electric current flowing through the electric cable is absorbed by the magnetic body.

For example, a noise current absorber (see Patent Document 1) is known, in which a pair of magnetic bodies shaped by dividing a cylindrical body in an axial direction is stored respectively in a pair of housings for a noise current absorber, and the pair of housings, in which the magnetic bodies are stored in this way, can be opened and closed via hinges. In this type of noise current absorber, when the housings are closed with the magnetic bodies stored in the housings and with an electric cable penetrating inside the cylindrical body, surfaces to be joined of the magnetic bodies divided into two pieces are put together. A magnetically closed magnetic circuit is hence established, thereby capable of obtaining a noise absorbing effect.

Further, there have been known a technique, in which a magnetic body is provided with a groove and a housing is provided with a projection to be engaged with the groove, so that the magnetic body is prevented from dropping off the housing when a noise current absorber opens.

PRIOR ART DOCUMENT

Patent Document

Patent Document 1: Japanese Examined Utility Model Publication No. H5-37453

SUMMARY OF THE INVENTION

Problems to be Solved by the Invention

Magnetic bodies stored in a housing are usually manufactured by sintering. The magnetic bodies are shrank by sintering and drop in size. Shrinking of the magnetic bodies varies due to variations in density upon molding, therefore it is difficult to obtain the magnetic bodies sized equally with high precision after sintering.

If the magnetic body is manufactured oversized, it may be difficult to insert the magnetic body in the housing, or the magnetic body may be damaged when being engaged with an engagement protrusion. In order to avoid these risks, the magnetic body can be manufactured slightly smaller than the housings.

When a noise current absorber is closed and attached to an electric cable, if joined surfaces of the magnetic bodies divided into two pieces are misaligned and a joined area lessens, an effect of noise absorbing is reduced.

However, when the magnetic bodies manufactured small based upon the aforementioned reason are stored in the housing, a large clearance is generated between an inner surface of the housing and the magnetic bodies. The magnetic bodies therefore move in the housing, and the positioning of the magnetic bodies in the housing can not be controlled when the noise current absorber is closed. As a result, a misalignment of the joined surfaces of the magnetic bodies is likely to increase when the noise current absorber is closed, so that a problem is observed that a noise absorbing characteristic varies a great deal.

The present invention, conceived to address the above-described problems, has an objective to provide a retainer and a noise current absorber which are capable of limiting movement of an item stored.

Means for Solving the Problems

A first aspect of the present invention to solve the above-described problems is a retainer having a pair of housings having opening surfaces and a connecting portion connecting outer peripheral surfaces of the pair of housings. The retainer is configured to be at a closed state with the opening surfaces of the pair of housings put together or adjoined and to be at an open state with the opening surfaces of the pair of housings separated. In this retainer, a part of a wall surface constituting each of the housings is structured as a flexible wall capable of deforming, and the connecting portion is connected to the flexible wall.

In the retainer configured in this way, when the retainer is shifted from an open state to a closed state, the flexible walls are pushed by the connecting portion and deformed, and the flexible walls are moved towards the inside of the housings. As a result, a clearance between an item stored in the housings and inner walls of the housings is reduced. Therefore, the movable range of the item stored in the housings can be reduced.

Accordingly, in the above-described retainer, it is possible to limit movement of the item stored when the retainer is at the closed state.

Further, as far as the aforementioned flexible walls are structured to be capable of deforming, the flexible walls can deform in any ways, such as elastic deformation or plastic deformation, and the structure of the flexible walls is not limited to a specific structure. For example, the flexible walls can be structured as below.

In the above-described retainer, the flexible wall may be a range placed between a plurality of slits formed to extend to ends of the wall surface.

In the retainer structured in this way, the flexible wall is a tongue piece sandwiched by the slits, so that the flexible walls can deform easily when the flexible walls are pushed by the connecting portion or the like.

The above-described retainer can be provided with a protrusion protruding from the flexible wall towards an inside of the housing.

In the retainer structured in this way, the protrusion is engaged with the item stored in the housings, so that the item stored can be inhibited from dropping off the housings.

Further, the protrusion is provided at the flexible wall. Therefore, even if the protrusion contacts the item stored when the item is stored in the housings, the flexible wall is deformed and the pressure applied to the protrusion and the item stored can be reduced, thereby capable of inhibiting the item stored or the protrusion from being damaged.

If the flexible walls are deformed outward, for example, by applying a force such that the pair of housings are separated, the protrusion formed at the flexible wall is moved outward accordingly. Therefore, when the item stored is to be removed from the housings, the protrusion is less likely to contact the item stored by deforming the flexible wall outward and moving the protrusion outward, thereby capable of easily removing the item.

In the retainer, a deforming direction of the flexible wall may be a direction towards a wall surface opposed to the flexible wall of the housing formed with the flexible wall.

In the retainer structured in this way, when the retainer is closed, the flexible wall deforms towards a wall surface opposed to the flexible wall (hereinafter, referred to an opposite wall surface) at the housing formed with the flexible wall. Therefore, when the retainer is closed, a clearance between the flexible wall and the opposite wall surface is reduced, and the item stored can be retained close to the opposite wall surface. Further, by configuring in a manner that the item stored is interposed by the flexible wall and the opposite wall surface, it is possible to retain the item stored more stably.

The retainer may further include: an engaging portion provided at one of the pair of housings; and an engaged portion provided at the other one of the pair of housings. The retainer may be configured to be maintained at the closed state with the engaging portion engaged with the engaged portion. The engaging portion and the engaged portion may be formed at the wall surface opposed to the flexible wall.

In the retainer structured in this way, among from the wall surfaces of the housings, a region (hereinafter referred to as an engagement region), where the engaging portion and the engaged portion are formed, is less likely to deform due to the engagement, so that the shape of the region is more stabilized compared with the other regions.

Accordingly, in a state where the retainer is at the closed state, even if the item disposed between the flexible wall and the engagement region contacts the engagement region, the shape of the wall surface does not change and the item can be retained stably. Further, by configuring in a manner that the item stored is interposed by the flexible wall and the engagement region, it is possible to retain the item stored more stably.

In the retainer described above, a spring constant of the connecting portion may be designed at a value larger than a spring constant of the flexible wall. In this case, the spring constant of the flexible wall may be selected so that the flexible wall bends when the pair of housings are closed.

The retainer described above is considered to be used for various purposes. Especially, it is beneficial that a magnetic body is selected as the item stored and the retainer is used as a noise current absorber storing the magnetic body therein.

A second aspect of the invention is a noise current absorber having the retainer described above and a pair of magnetic bodies shaped by dividing an annular body into two pieces in an axial direction.

This noise current absorber may be configured in a manner that the pair of magnetic bodies is stored in the pair of housings, respectively, and the pair of magnetic bodies is not joined when the pair of housings is at the open state and are joined to be annually shaped when the pair of housings is at the closed state.

In the same way as the retainer described above, in the noise current absorber configured in this way, it is possible to retain the magnetic bodies, which is the item stored, while limiting the movement of the magnetic bodies. That is, when the housings are closed, the misalignment of the joined area of the magnetic bodies is less likely to increase, so that fluctuations in noise absorbing characteristic can be diminished.

Further, by closing the noise current absorber, the magnetic bodies exhibit an annular shape and establish a magnetically closed magnetic circuit, thereby capable of obtaining a noise absorbing effect of an electric cable penetrating through the magnetic bodies.

The pair of magnetic bodies described above is not limited to any specific structure as far as they can join to be an annular shape. For example, the magnetic bodies may be formed to be an annular shape having a small thickness in an axial direction or to be an annular shape having a large thickness in the axial direction (i.e., a cylindrical shape).

Figure 1:
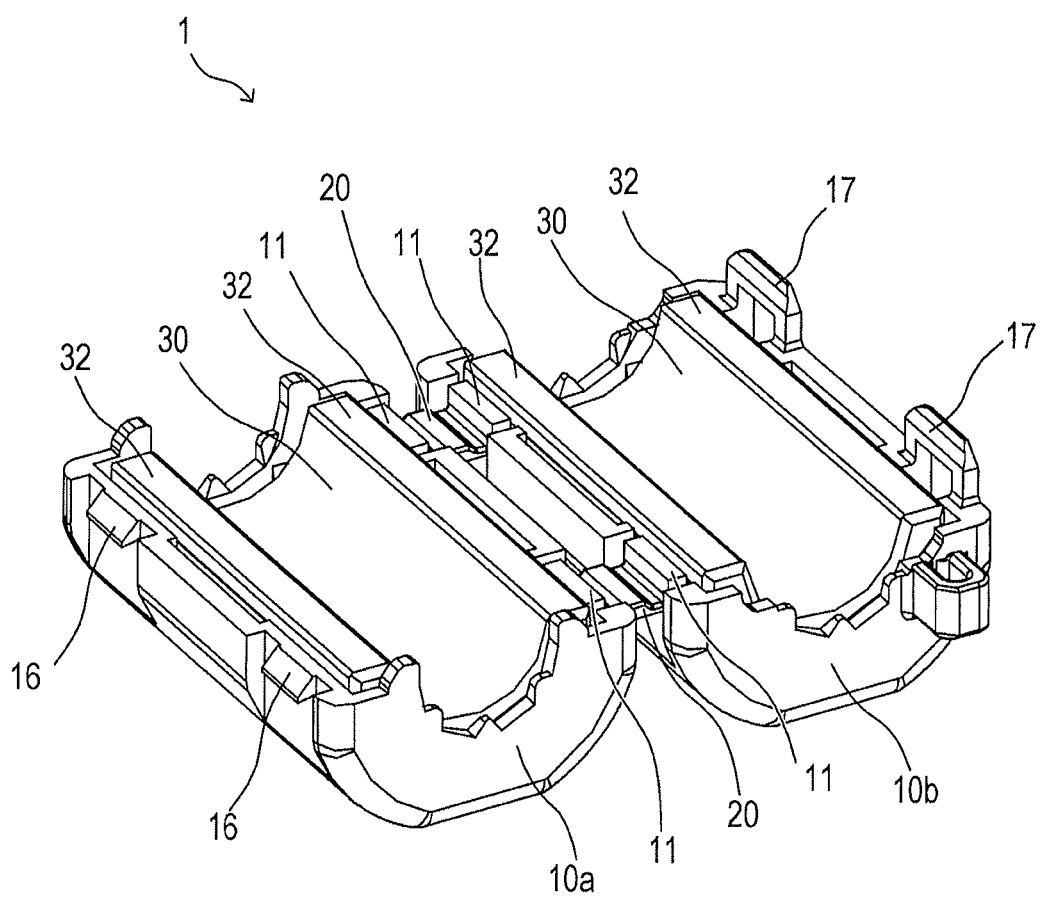
FIG. 1 is a perspective view illustrating a noise current absorber.

| EXPLANATION OF REFERENCE NUMERALS | |
| --- | --- |
| 1 noise current absorber, | 10a, 10b housings, |
| 11 flexible wall, | 12 slits, |
| 13 first protrusion, | 14 second protrusion, |
| 15 biasing piece, | 16 engaging portion, |
| 17 engaged portion, | 18 notch, |
| 20 connecting portion, | 21 convex portion |
| 22 extruded portion, | 30 ferrite, |
| 31 electric cable inserting groove, | |
| 32 joined surface, | 33 engagement groove, |
| 40 inserting hole, | 41, 42 notches |

MODE FOR CARRYING OUT THE INVENTION

Hereinafter, an embodiment of the present invention will be described with reference to the drawings.

(1) Overall Structure

As illustrated in FIG. 1, a noise current absorber 1 of the embodiment is configured with a pair of housings 10a and 10b, two connecting portions 20 connecting the housings 10a and 10b, and a pair of ferrites 30 respectively stored in the pair of housings 10a and 10b. The noise current absorber 1 is configured to inhibit transmission of noise (noise current) transmitted through an electric current. The ferrites 30 correspond to an example of magnetic bodies of the present invention.

Figure 2:
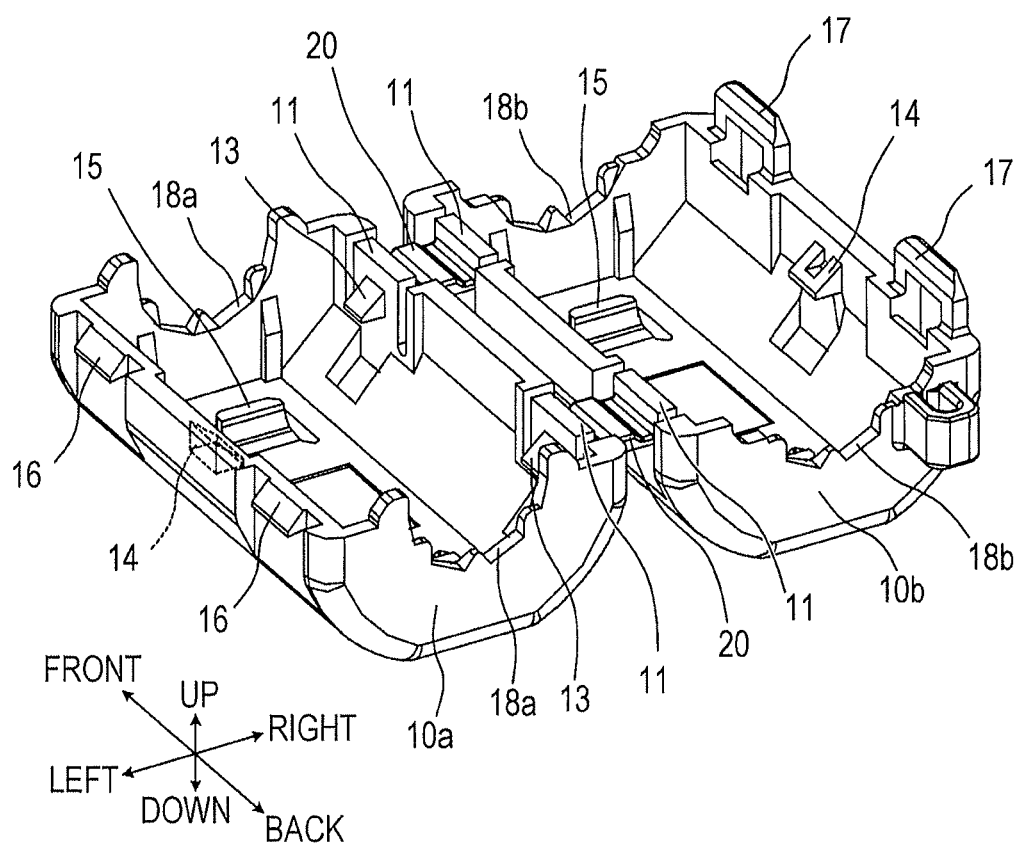
FIG. 2 is a perspective view illustrating a retainer (a state where ferrites are removed from a noise current absorber).

FIG. 2 illustrates a condition where the ferrites 30 are removed from the noise current absorber 1. A structure constructed of the pair of housings 10a and 10b and the connecting portions 20 in FIG. 2 is integrally formed with a synthetic resin, and this structure corresponds to an example of a retainer of the present invention.

Since the housings 10a and 10b are similar in structure, the correspondent structure is explained with reference to the housing 10a.

The housing 10a is shaped by dividing a hollow cylinder to two pieces in an axial direction and possesses an opening (open) surface at the upper side. The ferrite 30 can be put in and out through the opening (open) surface.

At a wall surface at the side of the housing 10b (the right side in the drawing), from among the wall surfaces configuring the housing 10a, portions near the front and back ends are formed as a pair of front and back flexible walls 11 each having an upper end portion adapted to oscillate and deform (hereinafter, may be described simply "bend") in a right and left direction. In the description below, the upper end portion of each of the flexible wall 11 indicates a tip end portion that oscillates.

Figure 3:
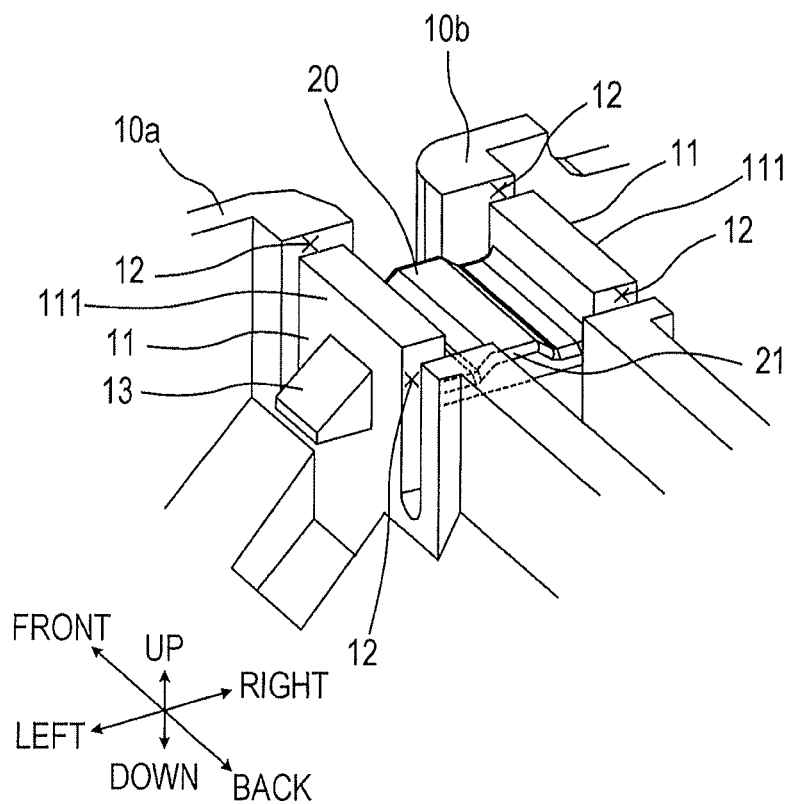
FIG. 3 is an enlarged perspective view illustrating flexible walls and the periphery thereof.

FIG. 3 illustrates an enlarged view of the vicinity of the flexible wall 11. The flexible wall 11 is positioned and placed between a plurality of slits 12 formed to extend downwardly from an end of the wall surface of the housing 10a. Therefore, the flexible wall 11 is a tongue piece partially independent of the front and back wall surfaces thereof, so that an upper end portion 111 can easily oscillate in the right and left direction.

The flexible wall 11 is formed with a first protrusion 13 protruding towards the inside of the housing 10a (to the left side in the drawing).

Here, going back to FIG. 2, the wall surface of the housing 10a, which is at an opposite side (to the left side in the drawing) of the wall surface formed with the flexible wall 11, is formed with a second protrusion 14 protruding towards the inside of the housing 10a (the right side in the drawing).

The housing 10a is formed, at its bottom surface, with a biasing piece 15 so as to protrude to the inside of the housing 10a, the biasing piece 15 biasing the ferrite 30 upwardly.

Next, a structure, which differs between the housing 10a and the housing 10b, will be described.

At the wall surface of the housing 10a, the wall surface being at an opposite side (the left side in the drawing) of the flexible walls 11, sticking engaging portions 16 are formed at two points distant from each other in the front and back direction and protrude towards the outside of the housing 10a (the left side in the drawing). On the other hand, regarding the housing 10b, at the wall surface of the housing 10b, the wall surface being at an opposite side of the flexible walls 11 (the right side in the drawing), engaged portions 17 are formed at two points distant from each other in the front and back direction. The engaged portions 17 are penetrating holes into which the engaging portions 16 can be inserted. The engaging portions 16 and the engaged portions 17 are provided at the wall surfaces facing the flexible walls 11, respectively.

Notches 18a and 18b are formed respectively at the front and back ends of the housing 10a and 10b, each of which exhibits an approximately semicircle shape and has a plurality of protrusions.

The connecting portions 20 are straight plate members connecting the outer peripheral surface of the housing 10a to the outer peripheral surface of the housing 10b, and are connected at the flexible walls 11 of the housings 10a and 10b, respectively. Further, as illustrated in FIG. 3, a central portion of each of the connecting portion 20 in the right and left direction is formed as a convex portion 21 having a larger thickness than the other portion. When the connecting portion 20 is bent, the portion other than the convex portion 21 is bent.

Figure 4:
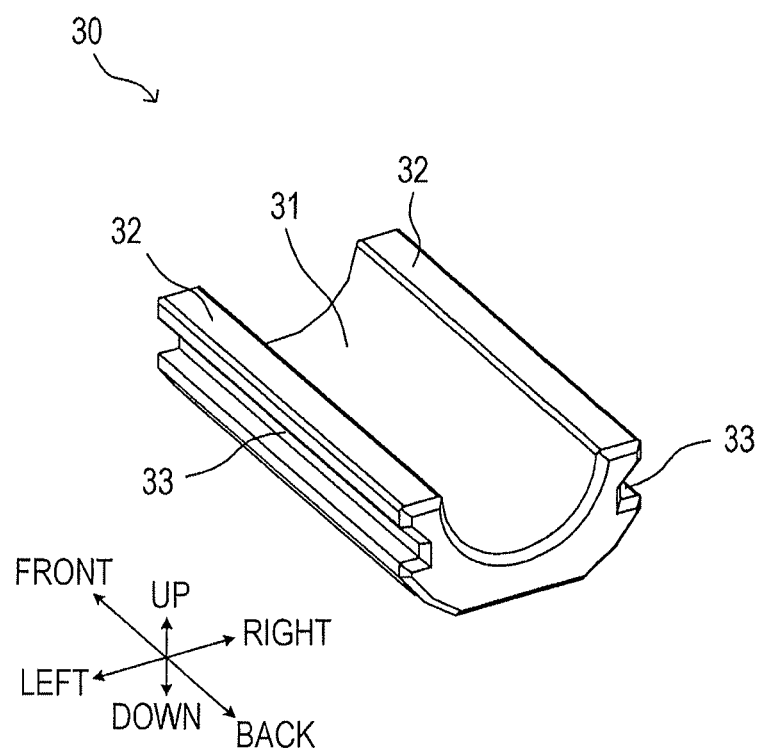
FIG. 4 is a perspective view illustrating the ferrite.

As illustrated in FIG. 4, each of the ferrites 30 are shaped by dividing an annular body having an axial length (i.e., a cylindrical body) to two pieces in an axial direction. An electric cable inserting groove 31, having a semicircle cross section, is formed at the center of the ferrite 30 along the axial direction (the front and back direction in the drawing). Surfaces to be joined 32 are formed at both sides of the ferrite 30.

Engagement grooves 33 are formed, at both right and left side surfaces of the ferrite 30, to be engaged with the first protrusions 13 and the second protrusion 14. The housings 10a and 10b each store the identical ferrites 30.

Figure 5A:
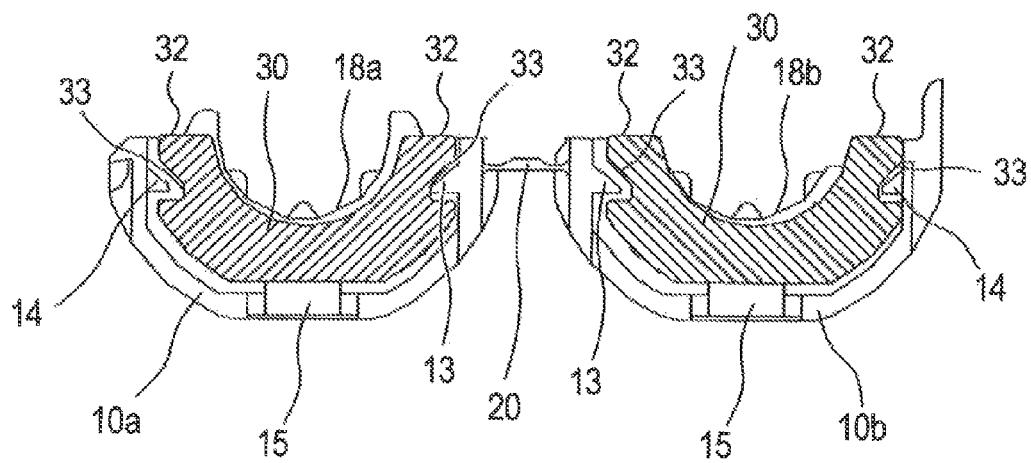
FIGS. 5A and 5B are cross sectional views of the noise current absorber in a front and back direction.
Figure 5B:
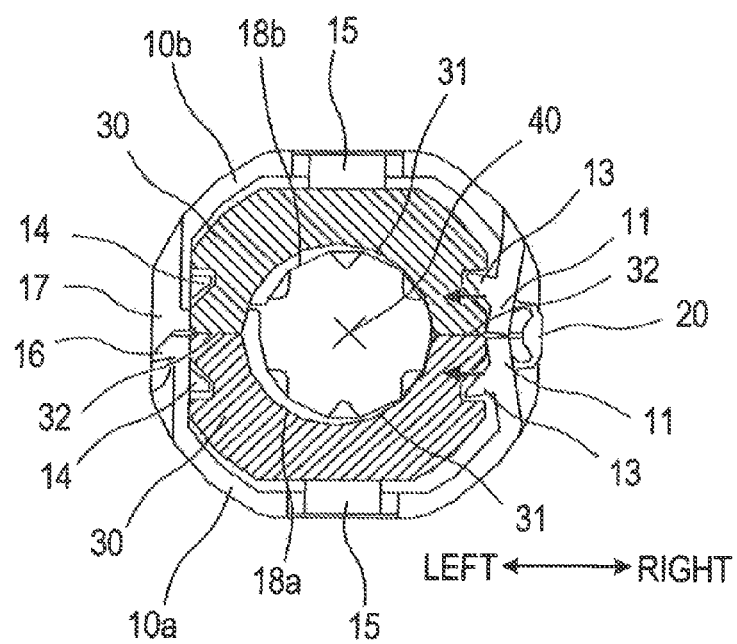

FIGS. 5A and 5B are side surface cross sectional views of the noise current absorber 1 having the above-described structure in the front and back direction.

As illustrated in FIG. 5A, the noise current absorber 1 is brought to an open state by separating the opening surfaces from each other, so that the ferrites 30 can be put in and out. The first protrusions 13 and the second protrusions 14 are engaged with the engagement grooves 33 of the ferrites 30, thereby preventing the ferrites 30 from easily dropping off the housings 10a and 10b. In this state, the ferrites 30 are not joined yet and do not exhibit an annular body.

Meanwhile, as illustrated in FIG. 5B, the housings 10a and 10b establish a closed state with the opening surfaces put together, thereby disabling the stored ferrites 30 from being taken out. Here, the engaging portions 16 are engaged with the engaged portions 17, thereby maintaining the noise current absorber 1 closed.

In the state where the noise current absorber 1 is at the closed state, the ferrites 30 exhibit the annular body with the joined surfaces 32 joined each other. A penetrating hole of the annular body, i.e., an area surrounded by the two electric cable inserting grooves 31, is an inserting hole 40 for the electric cable to be inserted through. Each of the ferrites 30 is biased by the biasing piece 15 towards each of the opening surface of each of the housings 10a and 10b, so that the ferrites 30 are joined securely.

The notches 18a and 18b of the housings 10a and 10b are positioned along the electric cable inserting grooves 31 of the ferrites 30, so that the inserting hole 40 is not covered even when the noise current absorber 1 is at the closed state.

(2) Effects of the Invention

According to the noise current absorber 1 configured described above, when the noise current absorber 1 is at the closed state, the upper ends of the flexible walls 11 are bent towards the insides of the housings 10a and 10b.

This mechanism will be described with reference to FIGS. 6A and 6B which are side views of the flexible walls 11 and the connecting portion 20 in the front and back direction. Referring to a flexible wall 11L at the left side in FIG. 6A, when the noise current absorber 1 is closed, a right-side flexible wall 11R is moved in an arrow X direction and turned upside down so as to move to the above of the flexible wall 11L.

Here, the connecting portion 20 is connected to the main surfaces of the flexible walls 11L and 11R. Therefore, when the noise current absorber 1 is shifted from the open state to the closed state, the connecting portion 20 is bent in accordance with the movement of the flexible wall 11R. At this point, an elastic force is generated where a bent portion of the connecting portion 20 tries to recover.

Figure 6A:
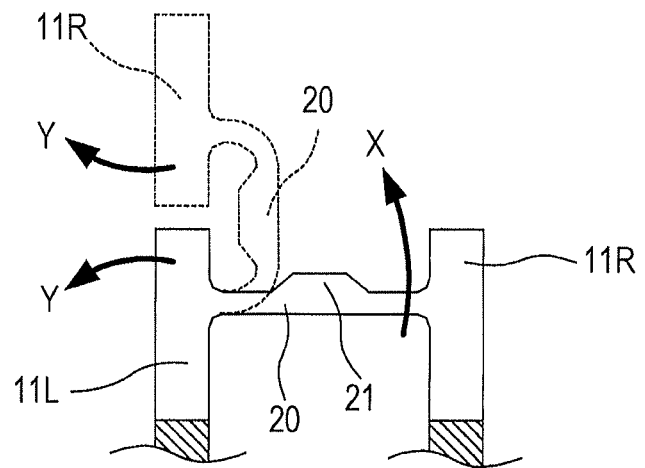
FIGS. 6A and 6B are cross sectional views of the flexible walls and a connecting portion in the front and back direction.
Figure 6B:
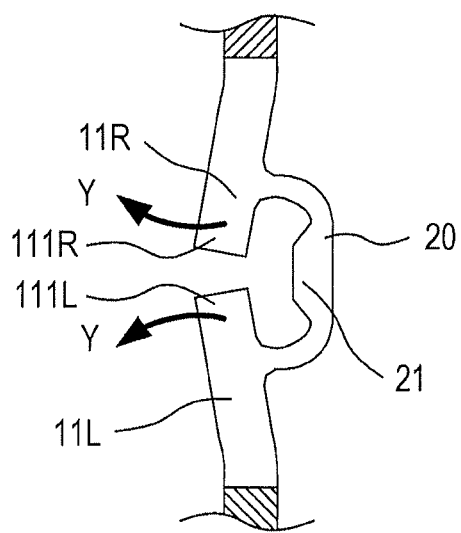

If the flexible walls 11L and 11R are configured with the upper ends that do not oscillate and do not deform, as illustrated by the broken line in FIG. 6A, only the connecting portion 20 is bent. However, because the flexible walls 11L and 11R are deformable, as illustrated in FIG. 6B, an upper end portion 111L of the flexible wall 11L and an upper end portion 111R of the flexible wall 11R are bent and deformed in an arrow Y direction so that a bent amount of the connecting portion 20 reduces.

As described above, when the noise current absorber 1 is closed, as illustrated in FIG. 5B, the upper end portions of the flexible walls 11 are bent and moved in the inside direction of the housings 10a and 10b (towards the wall surfaces opposed to the flexible walls 11). As a result, a clearance between the ferrites 30 and the wall surfaces of the housings 10a and 10b is reduced, and the ferrites 30 are pushed by the flexible walls 11 and positioned along the left-side wall surfaces of the housings 10a and 10b.

Accordingly, the ferrites 30 are retained at a position along the left-side wall surfaces, so that the pair of ferrites 30 is prevented from being joined while being misaligned from each other, and a joined area of the joined surfaces 32 of the ferrites 30 is stabilized around a certain value. As a result, fluctuations in noise absorbing characteristic due to the changes in the joined area, the changes created in every time of closing the noise current absorber 1 can be diminished.

Even if a clearance between the wall surfaces of the housings 10a, 10b and the ferrites 30 are not removed completely, as far as the clearance is reduced by the flexible walls 11, it is possible to reduce the movement range of the ferrites 30. In this case, the misalignment of the joined area can be reduced and the fluctuations in noise absorbing characteristic can be diminished.

In the noise current absorber 1 of the above embodiment, the engaging portions 16 and the engaged portions 17 are formed at the wall surfaces at the side of the direction in which the flexible walls 11 deform when the noise current absorber 1 is closed. When the engaging portions 16 are engaged with the engaged portions 17, a region (hereinafter referred to as an engagement region), where the engaging portions 16 and the engaged portions 17 are formed, is less likely to deform due to the engagement, so that the shape of the region is more stabilized compared with the other regions.

Accordingly, in a state where the noise current absorber 1 is at the closed state, even if the ferrites 30 disposed between the flexible walls 11 and the engagement region contacts the engagement region, the shapes of the wall surfaces do not change and the ferrites 30 can be retained stably.

In the noise current absorber 1 of the above embodiment, as described above, the bent amount of each of the connecting portions 20 is reduced due to the deformation of the flexible walls 11. As a result, it is possible to reduce a load against the connecting portion 20 and to prevent damage on the connecting portion 20.

Further, as inserting the ferrites 30 into the housings 10a and 10b, the first protrusions 13 and the second protrusions 14 are pushed outside by the ferrites 30 before being engaged with the engagement grooves 33. Here, in the noise current absorber 1 of the above embodiment, because the first protrusions 13 are attached at the flexible walls 11, the flexible walls 11 deform towards the outside of the housings 10a and 10b.

Therefore, at a time of inserting the ferrites 30 to the housings 10a and 10b, it is possible to lower a level of pressure applied by the first protrusion 13 to the ferrites 30 and to inhibit damage on the ferrites 30 being inserted.

By applying a force in a manner that the housings 10a and 10b are separated from each other and the flexible walls 11 are deformed towards the outside when the ferrites 30 are removed from the housings 10a and 10b, the first protrusions 13 are moved towards the outside and are less likely to contact the ferrites 30. Therefore, it is possible to easily remove the ferrites 30.

Figure 7:
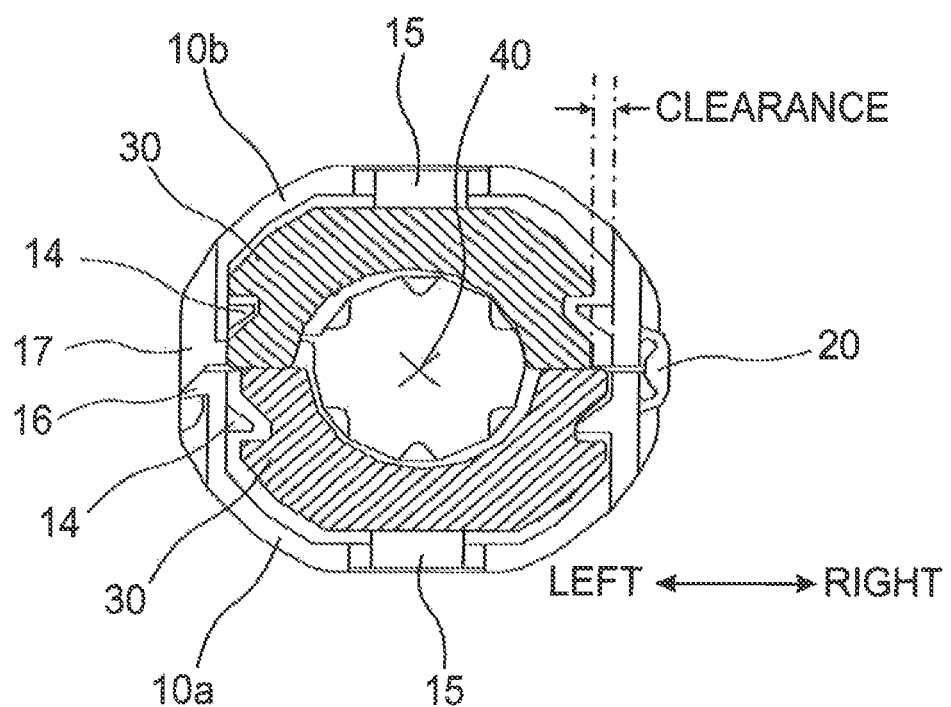
FIG. 7 is a cross sectional view of the noise current absorber of a comparative example in the front and back direction.

As a comparative example, FIG. 7 illustrates a cross sectional view of a noise current absorber configured not to have the flexible walls 11 (not to have a range to be deformed). In this noise current absorber, a clearance, where the ferrites 30 can be moved in the right and left direction, is large in a state where the ferrites 30 are stored in the housings 10a and 10b. Therefore, when the noise current absorber is closed, the positioning of the ferrites 30 in the right and left direction is not stabilized, and the joined area does not stay at a certain value and fluctuates. As a result, the noise absorbing characteristic fluctuates a great deal.

(3) Designing Plan of the Flexible Wall and the Connecting Portion

The noise current absorber 1 of the above embodiment is configured in such a manner that the connecting portions 20 and the flexible walls 11 are bent when the noise current absorber 1 is closed. However, if the flexible walls 11 are configured to be less likely to be bent compared with the connecting portions 20, only the connecting portions 20 are bent and the flexible walls 11 are not bent. In this case, there is a possibility that the aforementioned effect to prevent the misalignment can not be obtained enough.

Accordingly, a structure of the flexible walls 11 and the connecting portions 20 is considered in which the flexible walls 11 are bent enough.

The relationship between the connecting portion 11 and the connecting portion 20 can be considered as cantilevers joined vertically. When the noise current absorber 1 is closed, it is possible to recognize which starts to bend first, the flexible wall 11 or the connecting portion 20, by comparing the spring constants. A member having a large spring constant is rigid and a member having a small spring constant starts bending first.

The spring constant k is expressed by the following formula.

$$k = Ebt^3/4L^3$$

Here, E is a longitudinal elastic modulus (Young's modulus), b is a plate width, t is a plate thickness, and L is a length.

A longitudinal elastic modulus E is a constant inherent to a material. When the flexible walls 11 and the connecting portions 20 are made of the same material, the values of k' described below can be actually compared.

$$k' = bt^3/4L^3$$

Here, by designing the value of k' of the flexible wall 11 smaller than the value of k' of the connecting portion 20, the flexible wall 11 is bent first, so that the flexible walls 11 can be bent securely.

Figure 8A:
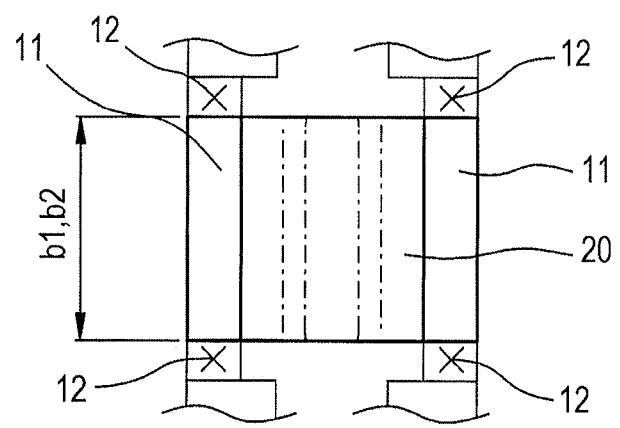
FIG. 8A is a top view for explaining a design example of the flexible walls.
Figure 8B:
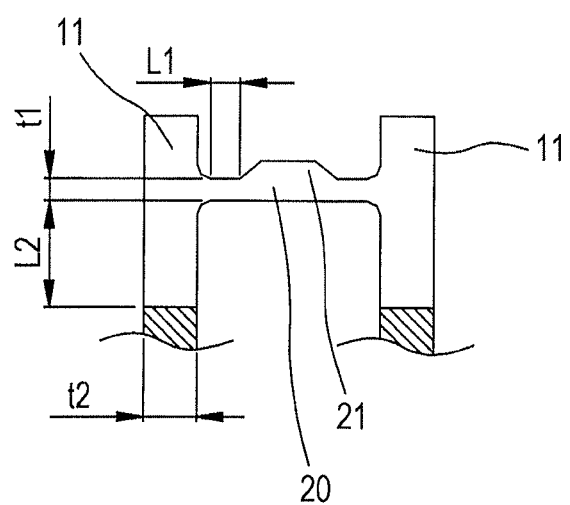
FIG. 8B is a side view for the same.

An explanation will be give with a specific example. FIG. 8A is a view in which the flexible walls 11 and the connecting portion 20 are seen from the above. FIG. 8B is a view in which the flexible walls 11 and the connecting portion 20 are seen form the front and back direction. As illustrated in FIG. 8A, according to the embodiment, the flexible walls 11 and the connecting portion 20 are the same in plate width. The convex portion 21 of the connecting portion 20 is large in thickness and is assumed as a rigid body and the other portion thereof is the subject for a bent region (length L)

Here, if the connecting portion 20 is designed to have a plate width b1 of 5 mm, a plate thickness t1 of 0.5 mm, a length L1 of 0.65 mm, k'=0.57 is obtained.

On the other hand, if the flexible wall 11 is designed to have a plate width b2 of 5 mm, a plate thickness t2 of 1.2 mm, and a length L2 of 1.85 mm, k'=0.34 is obtained.

Therefore, under the above condition, the value of k' of the flexible wall 11 is smaller than the value of k' of the connecting portion 20. The flexible wall 11 therefore starts bending earlier than the connecting portion 20 when the noise current absorber 1 is closed. The effect of the invention can be thus assured.

(4) Modified Example

The embodiment of the present invention was described above. The present invention however should not be construed as limited to the embodiment set forth above and can be achieved in any modes within the scope of the present invention.

For example, according to the above embodiment, each of the housings 10a and 10b has the flexible walls 11 at the two areas, and the flexible walls 11 of the housing 10a are connected to the flexible walls 11 of the housing 10b by the two connecting portions 20. However, the flexible walls 11 and the connecting portions 20 are not limited to the structure set forth above.

Figure 9A:
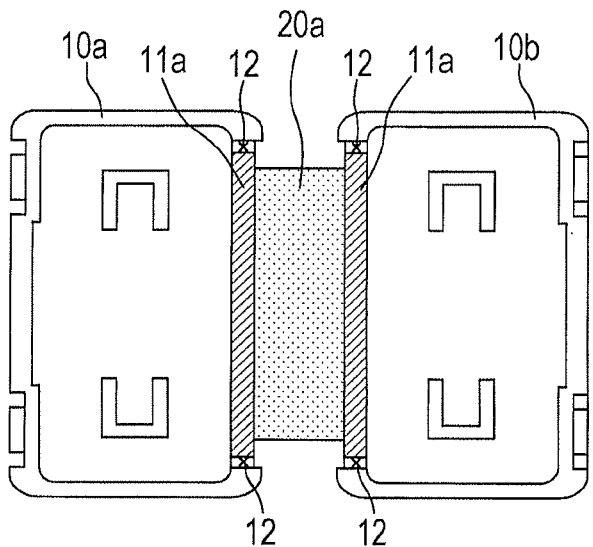
FIGS. 9A, 9B and 9C are views illustrating flexible walls of modified examples.
Figure 9B:
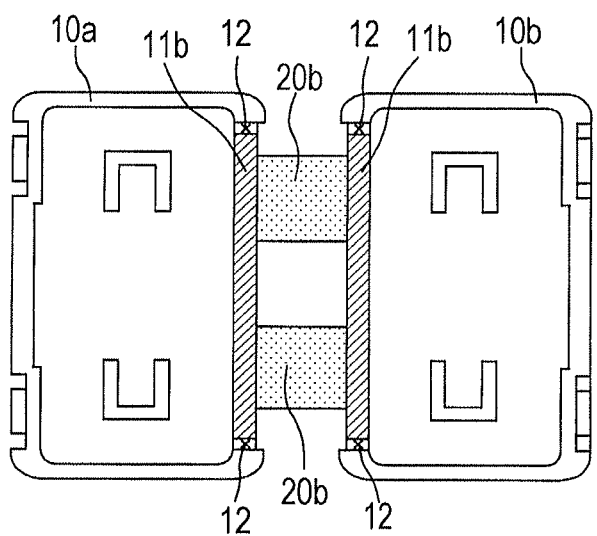
Figure 9C:
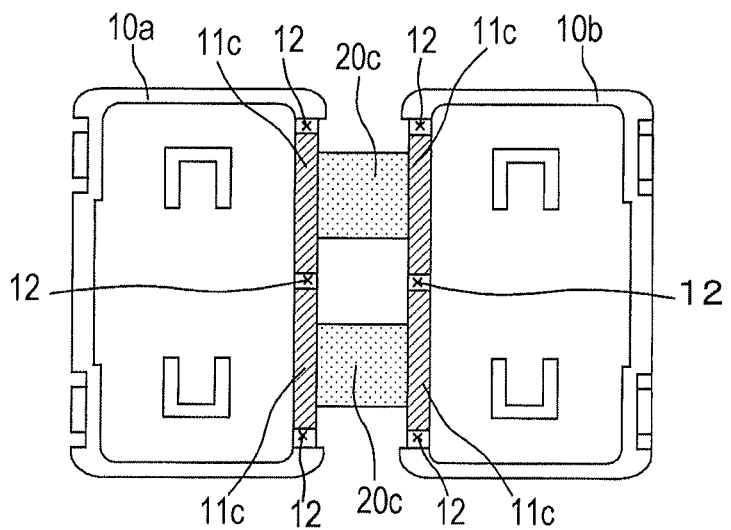

The specific example will be described with reference to FIGS. 9A, 9B, and 9C in each of which a noise current absorber is from the above. For example, as illustrated in FIG. 9A, each of the housings 10a and 10b has a singular flexible wall 11a, and the flexible wall 11a of the housing 10a can be connected to the flexible wall 11a of the housing 10b by a singular connecting portion 20a. As illustrated in FIG. 9B, a singular flexible wall 11b can be configured to be provided with a plurality of connecting portions 20b. As illustrated in FIG. 9C, flexible walls 11c can be configured to be adjacent to each other via slits 12.

According to the above embodiment, the connecting portion 20 is configured to be a straight plate member. However, the structure of the connecting portion 20 is not limited to the above-described structure and can be an R-shape not a straight shape.

Figure 10A:
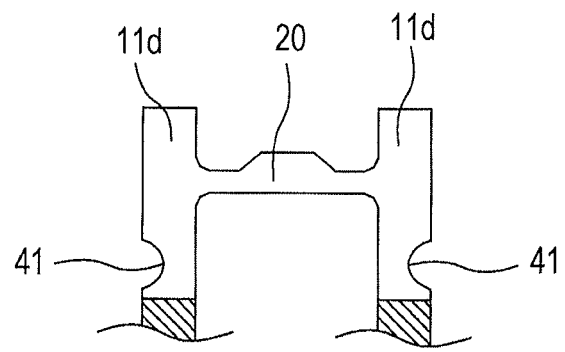
FIGS. 10A and 10B are views illustrating flexible walls of a modified example.
Figure 10B:
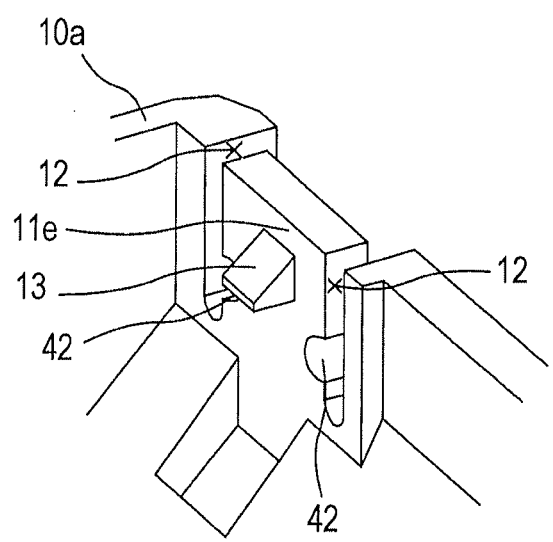

As illustrated in FIG. 10A, a flexible wall 11d can be configured to have a notch 41 so that a plate width of the flexible wall 11d is locally small. As illustrated in FIG. 10B, a flexible wall e can be configured to have notches 42 so that a plate thickness of the flexible wall 11e is locally small.

Figure 11A:
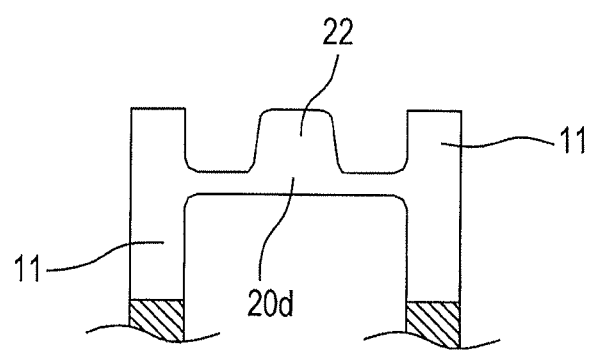
FIGS. 11A and 11B are views illustrating flexible walls of a modified example.
Figure 11B:
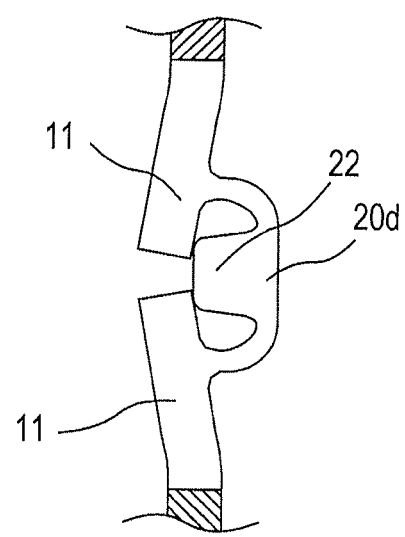

According to the above embodiment, the structure is illustrated, where the flexible walls 11 are pushed by a reaction force generated when the connecting portions 20 are bent. However, as illustrated in FIGS. 11A and 11B, an extruded portion 22 can be formed at the center of a connecting portion 20d, the extruded portion 22 having a protruding amount larger than a protruding amount of the convex portion 21. The flexible wall 11 can be configured to deform by being pushed by the extruded portion 22 when the noise current absorber 1 is closed.

The invention claimed is:

1. A retainer comprising:
   first and second housings having open surfaces for accommodating a respective body; and a connecting portion connecting outer peripheral surfaces of the first and second housings;
   wherein the retainer is configured to be moved into a closed state with the open surfaces of the first and second of housings mated together with one another and to be moved into an open state with the open surfaces of the first and second housings separated from one another; parts of wall surfaces comprising a portion of the first and second housings are configured as flexible walls capable of deforming, and the connecting portion is directly connected to the flexible wall of the first housing and the flexible wall of the second housing; and each of the flexible walls is defined between a pair of spaced apart slits formed in the outer peripheral surfaces of the first and second housings.

2. The retainer according to claim 1, wherein each of the flexible walls are deformable when acted upon by an elastic force of the connecting portion.

3. The retainer according to claim 1, further comprising:
   a protrusion which protrudes from each of the flexible walls towards an inside of the housing.

4. The retainer according to claim 1, wherein a deforming direction of each respective flexible wall is a direction towards an opposed wall surface of the respective first or second housings.

5. The retainer according to claim 1, further comprising:
   an engaging portion provided on the first housing; and
   an engaged portion provided on the second housing,
   wherein the retainer is configured to be maintained at the closed state with the engaging portion engaged with the engaged portion, and
   the engaging portion and the engaged portion are formed at the wall surfaces opposed to the flexible walls.

6. The retainer according to claim 1, wherein a spring constant of the connecting portion has a value larger than a spring constant of the flexible wall.

7. The retainer according to claim 6, wherein the spring constant of each of the flexible walls is selected so that each of the flexible walls bend when the first and second housings are in the closed state.

8. The retainer according to claim 1, further comprising:
   a pair of magnetic bodies shaped by dividing an annular body, in an axial direction, into two pieces,
   the pair of magnetic bodies is stored in the first and second housings, respectively, and
   the pair of magnetic bodies is not joined when the first and second housings are in the open state and are joined to be annually shaped when the first and second housings are in the closed state.

9. The retainer according to claim 1, further comprising
   a protrusion which protrudes from each of the flexible walls towards an inside of the housing; and
   a deforming direction of each respective flexible wall is a direction towards an opposed wall surface of the respective first or second housings.

10. The retainer according to claim 1,
    a protrusion which protrudes from each of the flexible walls towards an inside of the housing; and
    a deforming direction of each respective flexible wall is a direction towards an opposed wall surface of the respective first or second housings
    an engaging portion provided on the first housing; and
    an engaged portion provided on the second housing, wherein the retainer is configured to be maintained at the closed state with the engaging portion engaged with the engaged portion, and the engaging portion and the engaged portion are formed at the wall surfaces opposed to the flexible walls.

11. A retainer for noise current absorption comprising:

first and second housings having open surfaces which each accommodate a respective magnetic body; and a connecting portion connecting the first and second housings with one another, and the connecting portion comprising a central portion and opposed first and second ends;

a first wall portion being located between a pair of spaced apart slits formed in an outer peripheral surface of the first housing;

a second wall portion being located between a pair of spaced apart slits formed in the outer peripheral surface of the second housing; and a protrusion protruding from each of the first and the second wall portions towards an inside of the housing;

wherein the first end of the connecting portion is connected with the first wall portion while the second end of the connecting portion is connected with the second wall portion;

at least one of the first and the second ends and the first and the second wall portions are capable of deforming such that each of the protrusions being acted upon by a pressure, exerted by an elastic force of the connecting portion, to facilitate securely holding either an undersized or oversized magnetic body.

12. The retainer according to claim 11, wherein the connecting portion and first and second wall portions are integrally formed form a synthetic resin.

13. The retainer according to claim 11, wherein the first and the second wall portions are prevented from oscillate and deforming such that only the first and the second ends of the connecting portion are bent during a closed configuration of the retainer.

14. The retainer according to claim 11, wherein the first and the second ends of the connecting portion and the first and the second wall portions oscillate and deform when the retainer is in the closed state.

15. A retainer for noise current absorption comprising:

first and second housings having open surfaces which each accommodate a respective magnetic body; and first and second connecting portion connecting the first and second housings with one another, and the first and the second connecting portion each comprising a central portion and opposed first and second ends;

a first wall portion being located between a pair of spaced apart slits formed in an outer peripheral surface of the first housing;

a second wall portion being located between a pair of spaced apart slits formed in the outer peripheral surface of the first housing;

a third wall portion being located between a pair of spaced apart slits formed in an outer peripheral surface of the second housing;

a fourth wall portion being located between a pair of spaced apart slits formed in the outer peripheral surface of the second housing; and a protrusion protruding from each of the first, the second, the third and fourth wall portions towards an inside of the housing;

wherein the first end of the first connecting portion is connected with the first wall portion while the second end of the first connecting portion is connected with the third wall portion;

the first end of the second connecting portion is connected with the second wall portion while the second end of the second connecting portion is connected with the fourth wall portion;

at least one of the first and the second ends and the first and the second wall portions are capable of deforming such that each of the protrusions being acted upon by a pressure, exerted by an elastic force of the connecting portion, to facilitate securely holding either an undersized or oversized magnetic body.

* * * * *